United States Patent
Subramanian et al.

(10) Patent No.: US 6,445,072 B1
(45) Date of Patent: Sep. 3, 2002

(54) DELIBERATE VOID IN INNERLAYER DIELECTRIC GAPFILL TO REDUCE DIELECTRIC CONSTANT

(75) Inventors: Ramkumar Subramanian, San Jose, CA (US); Bhanwar Singh, Morgan Hill, CA (US); Michael K. Templeton, Atherton, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 09/617,158

(22) Filed: Jul. 17, 2000

(51) Int. Cl.[7] .......................................... H01L 21/4763
(52) U.S. Cl. ..................... 257/758; 257/759; 257/760; 257/637; 257/641
(58) Field of Search ................................ 257/410, 522, 257/750, 758–763, 576, 752, 753, 634–641, 644, 649, 650; 438/618–624, 672, 696, 702, 763

(56) References Cited

U.S. PATENT DOCUMENTS

| | | | |
|---|---|---|---|
| 5,407,860 A | 4/1995 | Stoltz et al. | 437/180 |
| 5,461,003 A | 10/1995 | Havemann et al. | 438/666 |
| 5,705,430 A | 1/1998 | Avanzino et al. | 437/195 |
| 5,949,143 A | 9/1999 | Bang | 257/758 |
| 5,955,786 A | 9/1999 | Avanzino et al. | 257/758 |
| 5,994,776 A | 11/1999 | Fang et al. | 257/758 |
| 6,025,260 A | * 2/2000 | Lien et al. | 438/619 |
| 6,054,381 A | 4/2000 | Okada | 438/624 |
| 6,057,226 A | 5/2000 | Wong | 438/623 |
| 6,064,118 A | 5/2000 | Sasaki | 257/758 |
| 6,153,512 A | * 11/2000 | Chang et al. | 438/624 |
| 6,190,996 B1 | * 2/2001 | Ngo et al. | 438/257 |
| 6,251,799 B1 | 6/2001 | Lai et al. | 438/760 |

FOREIGN PATENT DOCUMENTS

| | | | |
|---|---|---|---|
| EP | 872887 A2 | * 10/1998 | |
| EP | 1014440 | 6/2000 | H01L/21/768 |

OTHER PUBLICATIONS

American Heritage Dictionary, 1976, Houghton Mifflin Co., p. 27.*

* cited by examiner

Primary Examiner—Minh Loan Tran
Assistant Examiner—Thomas L. Dickey
(74) Attorney, Agent, or Firm—Amin & Turocy, LLP

(57) ABSTRACT

One aspect of the present invention relates to a method of forming an innerlayer dielectric, involving the steps of providing a substrate having at least two metal lines thereon; providing a conformal insulation layer over the substrate and metal lines; forming a second insulation layer over the conformal insulation layer, the second insulation layer containing a void positioned between two metal lines; at least one of thinning and planarizing the second insulation layer; and forming a third insulation layer over the second insulation layer. Another aspect of the present invention relates to an innerlayer dielectric semiconductor structure, containing a semiconductor substrate having at least two metal lines thereon; a conformal insulation layer over the semiconductor substrate and metal lines, the conformal insulation layer having a substantially uniform thickness from about 250 Å to about 5,000 Å; a second insulation layer over the conformal insulation layer, the second insulation layer containing a void positioned between two metal lines; and a third insulation layer over the second insulation layer.

14 Claims, 3 Drawing Sheets

DELIBERATE VOID IN INNERLAYER DIELECTRIC GAPFILL TO REDUCE DIELECTRIC CONSTANT

TECHNICAL FIELD

The present invention generally relates to processing a semiconductor substrate to reduce the dielectric constant of an innerlayer dielectric. In particular, the present invention relates to providing a void in an innerlayer dielectric thereby reducing the dielectric constant.

BACKGROUND ART

An integrated circuit consists of electronic devices electrically coupled by conductive trace elements called interconnect lines (interconnects). Interconnects are patterned from layers of electrically conductive materials (e.g., metals such as aluminum and/or copper, doped polysilicon, etc.) formed on the surface of a silicon wafer. Multiple layers (or levels) of closely-spaced interconnects allow an increase in the density of devices formed on semiconductor wafers. Electrical separation of stacked interconnect layers is achieved by placing an electrically insulating material (i.e., interlevel dielectric layer) between the vertically spaced interconnect layers. Electrical separation of adjacent interconnect lines is achieved by placing an electrically insulating material (i.e., innerlayer dielectric) between the conductive interconnect lines.

Many types of materials are employed as insulating materials. Examples include oxides, silicates, nitrides, low k materials, and air. These insulating materials have different properties and characteristics; thus, different insulating materials are used depending upon the requirements of a given environment. Although air lacks the structural integrity of oxides, silicates, nitrides, and low k materials, air is the cheapest and has the lowest dielectric constant (about 1). Therefore, in many instances it is desirable to employ air as an insulating material. The requirement of structural integrity, however, limits the extent to which air is employed in semiconductor manufacturing.

In very large scale integrated (VLSI) circuit devices, several wiring layers each containing numerous interconnect lines are often required to connect together the active and/or passive elements in a VLSI semiconductor chip. The interconnection structure typically consists of thin conductive lines separated by insulation in one layer or level and connected through vias or studs from contacts of the elements of the semiconductor chip or to a similar layer in another level of interconnections. With the trend to higher and higher levels of integration in semiconductor devices to ultra large scale integrated (ULSI) circuits, the space or gap between the wires or conductive lines to be filled with insulation is becoming extremely narrow, such as about 0.18 microns and smaller. In addition, when the height of the conductive lines is increased, it is more difficult to fill gaps between the lines, especially when the aspect ratio is 2 to 1 or greater with a gap distance of 0.25 microns or smaller.

In order to satisfy increasingly higher density requirements, the dimensions of integrated circuits are continuously reduced and, hence, the line widths of the conductors decreased into the submicron range. While the conductors become narrower and narrower, and the space between conductors becomes narrower and narrower, the stresses imposed upon the conductive material increase, thereby resulting in a high failure rate. Many of these failures stem from the effects of voids that generate stress migration as a result of thermal stresses caused by exposure at different temperatures, air in contact with the conductive lines, or to subsequent processing. These voids, which can range from 0.05 microns to about 10 microns or more, when in contact with metal lines can lead to failures causing open circuits.

Referring to FIGS. 1 and 2, this problem is illustrated. In FIG. 1, a substrate 10 is provided with metal lines 12, and an insulator 14 thereover. An air void 16 is positioned between metal lines 12 to increase the insulation therebetween. FIG. 2 shows the effects of thermal processing on the structure of FIG. 1. In particular, the air void 16 undesirably shifts so that it contacts one of the metal lines 12 due to the effects of semiconductor processing, such as repeated thermal cycles or etching. Consequently, stress is imposed upon the metal lines 12 as well as upon the device once fabrication is completed.

SUMMARY OF THE INVENTION

The present invention provides an innerlayer dielectric structure and method of making such a structure wherein an air void is positioned between metal lines, thereby providing excellent insulation properties. As a result of the present invention, improved insulation is achieved because the use of air, with its low dielectric constant, is employed as an innerlayer dielectric with minimal risks of deleterious air void shifting. Also as a result of the present invention, the use of air as an innerlayer dielectric is enabled despite the use of aggressive processing steps after formation of the innerlayer dielectric.

One aspect of the present invention relates to a method of forming an innerlayer dielectric, involving the steps of providing a substrate having at least two metal lines thereon; providing a conformal insulation layer over the substrate and metal lines; forming a second insulation layer over the conformal insulation layer, the second insulation layer containing a void positioned between two metal lines; at least one of thinning and planarizing the second insulation layer; and forming a third insulation layer over the second insulation layer.

Another aspect of the present invention relates to a method of forming an innerlayer dielectric having a dielectric constant of about 1, involving the steps of providing a substrate having at least two metal lines thereon; providing a conformal silicon nitride layer over the substrate and metal lines, the conformal silicon nitride layer having a substantially uniform thickness from about 250 Å to about 5,000 Å; forming a first insulation layer over the conformal silicon nitride layer, the first insulation layer containing an air void positioned between two metal lines; at least one of thinning and planarizing the first insulation layer; and forming a second insulation layer over the first insulation layer.

Yet another aspect of the present invention relates to an innerlayer dielectric semiconductor structure, containing a semiconductor substrate having at least two metal lines thereon; a conformal insulation layer over the semiconductor substrate and metal lines, the conformal insulation layer having a substantially uniform thickness from about 250 Å to about 5,000 Å; a second insulation layer over the conformal insulation layer, the second insulation layer containing a void positioned between two metal lines; and a third insulation layer over the second insulation layer.

Still yet another aspect of the present invention relates to an innerlayer dielectric semiconductor structure, containing a semiconductor substrate having at least two metal lines thereon; a conformal silicon nitride layer over the semiconductor substrate and metal lines, the conformal silicon nitride layer having a substantially uniform thickness from about 1,000 Å to about 3,000 Å; a first insulation layer over the conformal silicon nitride layer, the first insulation layer containing an air void positioned between two metal lines; and a second insulation layer having a thickness from about 2,500 Å to about 10,000 Å over the first insulation layer.

DISCLOSURE OF INVENTION

The present invention is now described in relation to the drawings, where like numerals are used for corresponding features throughout. The present invention may be adapted to making innerlayer dielectrics for various device structures, active elements and passive elements including polysilicon gates, wordlines, source regions, drain regions, bit lines, bases, emitters, collectors, conductive lines, conductive plugs, diffusion regions, etc. The present invention may be used with any suitable semiconductor technology including but not limited to NMOS, PMOS, CMOS, BiCMOS, bipolar, multi-chip modules (MCM) and III-IV semiconductors.

Figure 1:
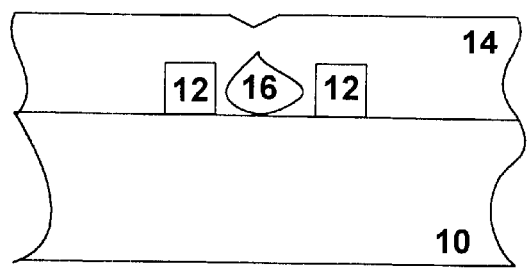
FIG. 1 illustrates a cross-sectional view of a prior art innerlayer dielectric structure.
Figure 2:
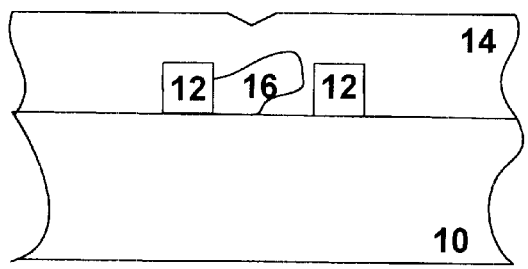
FIG. 2 illustrates a cross-sectional view of a prior art innerlayer dielectric structure.
Figure 3:
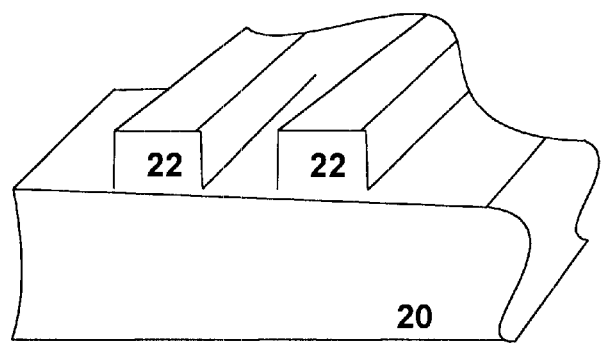
FIG. 3 illustrates a cross-sectional view of one aspect of the innerlayer dielectric method/structure of the present invention.

Referring to FIG. 3, semiconductor a substrate 20 is provided. Metal lines 22 are formed over substrate 20 by any suitable technique. For example, a metal layer is formed over the entire substrate 20, and a photoresist deposited over the metal layer. The photoresist is the patterned (in the pattern of the metal lines 22) exposing a portion of the metal layer, and used as a mask to selectively remove the exposed portions of the metal layer. The remaining patterned photoresist is stripped from the structure leaving metal lines 22 over substrate 20.

Semiconductor substrate 20 may include any suitable semiconductor material, for example, a monocrystalline silicon substrate. Semiconductor substrate 20 may include of one or more layers including substrate layers, diffusion regions, dielectric layers such as oxides and nitrides, devices, polysilicon layers, and the like. Metal lines 22 contain a conductive metal. In one embodiment, the metal lines are made from a single conductive metal layer. In another embodiment, the metal lines are made from two metal layers; for example, a conductive metal layer and a barrier metal layer. Metal layers include layers of a single metal as well as metal alloy layers containing two or more metals. Conductive metals include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and any other alloys thereof. Aluminum alloys typically contain aluminum and one or more of copper, chromium, cobalt, gold, nickel, palladium, platinum, silver, tungsten and zinc. Copper alloys typically contain copper and one or more of aluminum, chromium, cobalt, gold, nickel, palladium, platinum, silver, tungsten and zinc.

The metal lines 22 have a thickness suitable for operating as an electrical interconnection. In one embodiment, the metal lines have a thickness from about 1,000 Å to about 20,000 Å. In another embodiment, the metal lines have a thickness from about 2,000 Å to about 15,000 Å. In yet another embodiment, the metal lines have a thickness from about 2,500 Å to about 10,000 Å.

The metal lines 22 also have a width suitable for operating as an electrical interconnection. In one embodiment, the metal lines have a width from about 500 Å to about 20,000 Å. In another embodiment, the metal lines have a width from about 1,000 Å to about 15,000 Å. In yet another embodiment, the metal lines have a width from about 2,000 Å to about 10,000 Å.

The distance between any two individual metal lines 22 on a substrate varies, but it is typically at least about 2,500 Å. In another embodiment, the distance between individual metal lines 22 on a substrate is at least about 1,800 Å. In yet another embodiment, the distance between individual metal lines 22 on a substrate is at least about 1,300 Å.

Figure 4:
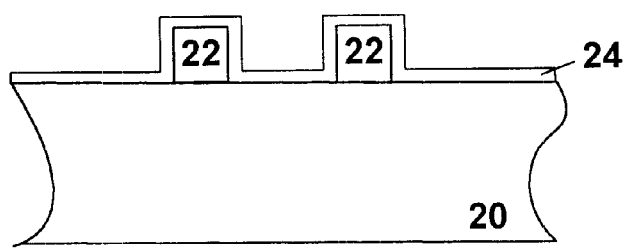
FIG. 4 illustrates a cross-sectional view of one aspect of the innerlayer dielectric method/structure of the present invention.

Referring to FIG. 4, a thin conformal insulation layer 24 is formed over the metal lines 22 and the exposed portions of the substrate 20. The thin conformal insulation layer 24 is typically one of silicon nitride, silicon dioxide, or silicon oxynitride. In a preferred embodiment, a conformal silicon nitride layer is formed over the metal lines 22. The thin conformal insulation layer 24 is relatively thin compared to the thickness of the metal lines 22 as it follows the contours of the metal lines 22 and the exposed portions of the substrate 20. In this connection, the thickness of the thin conformal insulation layer 24 is substantially uniform across the structure.

The thin conformal insulation layer 24 has a thickness suitable for insulating a metal line and/or functioning as a barrier for preventing contact between the air void (described later) and the metal lines 22. In one embodiment, the thin conformal insulation layer 24 has a thickness from about 250 Å to about 5,000 Å. In another embodiment, the thin conformal insulation layer 24 has a thickness from about 500 Å to about 4,000 Å. In yet another embodiment, the thin conformal insulation layer 24 has a thickness from about 1,000 Å to about 3,000 Å.

Silicon nitride layer can be formed using any suitable technique including chemical vapor deposition (CVD) techniques, such as low pressure chemical vapor deposition (LPCVD) or chemical vapor deposition (PECVD). In one embodiment, the silicon nitride is made using a one step PECVD or LPCVD technique such as simultaneously employing gases containing silicon and nitrogen, such as using $SiH_4$ or $SiCl_2H_2$ and $N_2$ or $NH_3$. In this embodiment, the silicon nitride layer is made using LPCVD techniques ($SiCl_2H_2$ and $NH_3$) and contains $Si_3N_4$. Although termed silicon nitride herein, a silicon nitride layer formed in accordance with the present invention may additionally contain hydrogen, especially in embodiments where the silicon nitride layer is made using PECVD techniques, and thus may also be characterized by the chemical formula $Si_xN_yH_z$. Both silicon dioxide and silicon oxynitride layer can be formed using any suitable technique including CVD techniques, such as LPCVD or PECVD techniques.

Figure 5:
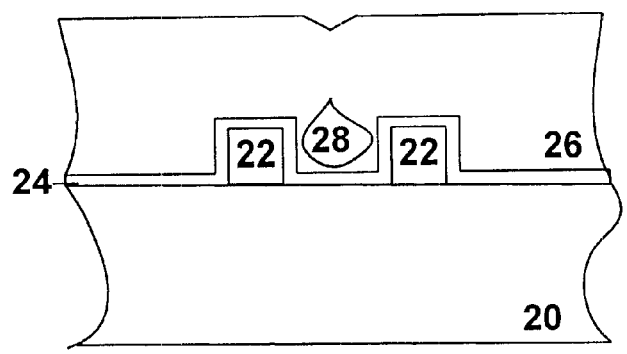
FIG. 5 illustrates a cross-sectional view of one aspect of the innerlayer dielectric method/structure of the present invention.

Referring to FIG. 5, a void containing or gap-fill dielectric is deposited over the structure to provide a preliminary gap-fill dielectric layer 26 containing voids 28 between at least two metal lines 22. Voids are not typically formed between metal lines that are spaced relatively close together (for example, metal lines that are less than about 200 nm apart). The preliminary gap-fill dielectric layer 26 contains an insulation material, and is formed by any suitable means over the thin conformal insulation layer 24 so that a void 28 is formed between at least two metal lines 22. The void 28 typically contains air, but contents are primarily determined by the atmosphere in which the preliminary gap-fill dielectric layer 26 is formed. In this connection, the void 28 may contain an inert gas.

The preliminary gap-fill dielectric layer 26 includes any suitable dielectric material or materials, including one or more of silicon dioxide, fluorine doped silicon glass (FSG), tetraethylorthosilicate (TEOS), phosphosilicate glass (PSG), borophosphosilicate glass (BPSG), any suitable spin-on glass, or low K polymer materials. Both siloxane and silicate based spin-on glasses may be employed.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

Preliminary gap-fill dielectric layer 26 may be formed to any suitable thickness using any suitable technique that may depend, for instance, on the material or materials used. For example, in the case of silicon dioxide, FSG, TEOS, PSG, and BPSG, CVD techniques, such as high density plasma chemical vapor deposition (HDP-CVD), LPCVD or PECVD, are useful. Alternatively, silicon may be sputtered in an atmosphere containing oxygen or grown using thermal oxidation techniques. In embodiments where the oxide is a glass, spin-on techniques may be employed.

The preliminary gap-fill layer 26 has an initial thickness suitable for covering the structure (the thin conformal insulation layer 24 in particular) and for facilitating formation of a void 28. In one embodiment, the preliminary gap-fill layer 26 has a thickness from about 1,000 Å to about 30,000 Å. In another embodiment, the preliminary gap-fill layer 26 has a thickness from about 2,000 Å to about 20,000 Å. In yet another embodiment, the preliminary gap-fill layer 26 has a thickness from about 2,500 Å to about 10,000 Å. The thickness of the preliminary gap-fill layer 26 is the average of the thickness measured over the metal lines 22 and the thickness measure over the substrate 20.

Figure 6:
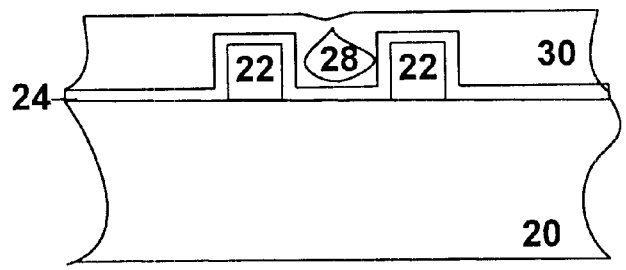
FIG. 6 illustrates a cross-sectional view of one aspect of the innerlayer dielectric method/structure of the present invention.

Referring to FIG. 6, the preliminary gap-fill layer 26 is thinned and/or planarized to form a gap-fill layer 30. Thinning and/or planarization is carried out using any suitable techniques, such as chemical-mechanical polishing (CMP) or etching. Wet or dry etching may be employed. Plasma or liquid etching may also be employed. The choice of etchant depends primarily upon the identity of the material constituting the preliminary gap-fill layer 26.

In one embodiment, the gap-fill layer 30 has a thickness from about 1,000 Å to about 20,000 Å. In another embodiment, the gap-fill layer 30 has a thickness from about 2,000 Å to about 15,000 Å. In yet another embodiment, the gap-fill layer 30 has a thickness from about 2,500 Å to about 8,000 Å. The thickness of the gap-fill layer 30 is the average of the thickness measured over the metal lines 22 and the thickness measure over the substrate 20.

Figure 7:
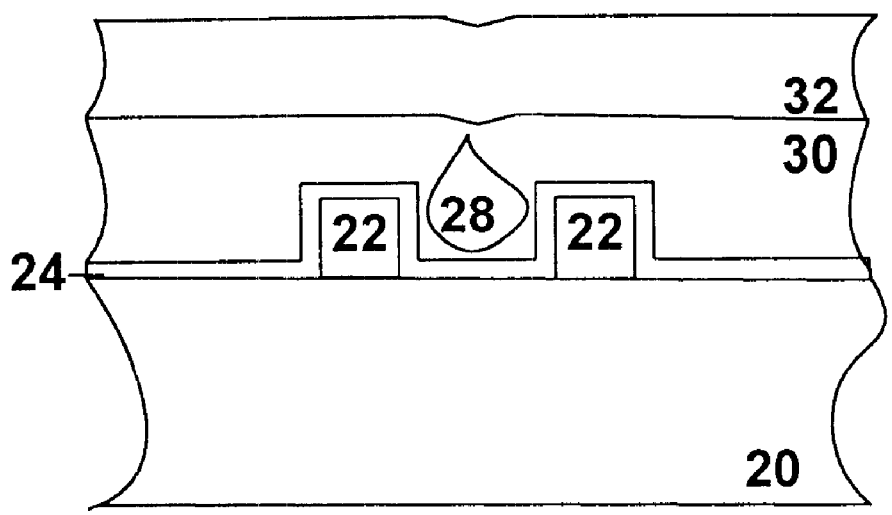
FIG. 7 illustrates a cross-sectional view of one aspect of the innerlayer dielectric method/structure of the present invention.

Referring to FIG. 7, a via dielectric layer 32 is formed over the gap-fill layer 30. Via dielectric layer 32 serves to ensure that void 28 is encapsulated from the top of the structure, especially since the thinning and/or planarization step may remove a substantial amount of the preliminary gap-fill layer 26 directly over the void 28. Depending upon the manner in which the preliminary gap-fill layer 26 is formed, a dip just above the void 28 may be present, thereby further potentially lowering the thickness of preliminary gap-fill layer 26 directly over the void 28. Accordingly, via dielectric layer 32 serves to further planarize the structure.

The via dielectric layer 32 includes any suitable dielectric material or materials, including one or more of silicon dioxide, FSG, TEOS, PSG, BPSG, any suitable spin-on glass including siloxane and silicate based spin-on glasses, or low K polymer materials (as described above in connection with the preliminary gap-fill layer 26). In one embodiment, the gap-fill layer 30 and the via dielectric layer 32 are constituted by different materials. In another embodiment, the gap-fill layer 30 and the via dielectric layer 32 are constituted by the same materials. In instances where the gap-fill layer 30 and the via dielectric layer 32 are constituted by the same materials, it is emphasized that they are applied in different steps.

Specific examples of combinations of materials include embodiments where the gap-fill layer contains silicon dioxide and the via dielectric layer contains TEOS, BPSG or PSG; where the gap-fill layer contains silicon dioxide and the via dielectric layer contains a spin-on glass; where the gap-fill layer contains silicon dioxide and the via dielectric layer contains a low K polymer material; where the gap-fill layer contains TEOS, BPSG or PSG and the via dielectric layer contains a spin-on glass; where the gap-fill layer contains TEOS, BPSG or PSG and the via dielectric layer contains silicon dioxide; where the gap-fill layer contains TEOS, BPSG or PSG and the via dielectric layer contains a low K polymer material; where the gap-fill layer contains a low K polymer material and the via dielectric layer contains a spin-on glass; where the gap-fill layer contains a low K polymer material and the via dielectric layer contains silicon dioxide; and where the gap-fill layer contains a low K polymer material and the via dielectric layer contains TEOS, BPSG or PSG.

The via dielectric layer 32 may be formed to any suitable thickness using any suitable technique that may depend, for instance, on the material or materials used (again, as described above in connection with the preliminary gap-fill layer 26). In one embodiment, the via dielectric layer 32 has a thickness from about 1,000 Å to about 20,000 Å. In another embodiment, the via dielectric layer 32 has a thickness from about 2,000 Å to about 15,000 Å. In yet another embodiment, the via dielectric layer 32 has a thickness from about 2,500 Å to about 10,000 Å.

The above described structure leads to the formation of electrical devices having desirable electrical properties since the air void serves as an excellent insulator (having a dielectric constant of about 1). As a result of the structure/method of the present invention, an air void is prevented from contacting metal when the air void is employed as an innerlayer dielectric. Moreover, due to the structure/method of the present invention, an air void is prevented from shifting or migrating with deleterious effects when it is employed as an innerlayer dielectric.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming an innerlayer dielectric, comprising:
    providing a semiconductor substrate having at least two metal lines thereon;
    providing a conformal insulation layer over the substrate and metal lines, the conformal insulation layer comprising silicon nitride and having a substantially uniform thickness from about 1,000 Å to about 5,000 Å;
    forming a second insulation layer comprising silicon dioxide over the conformal insulation layer, the second insulation layer comprising a void positioned between two metal lines, the void comprising an inert gas;
    at least one of thinning and planarizing the second insulation layer; and
    forming a third insulation layer comprising tetraethylorthosilicate over the second insulation layer.

2. The method of claim 1, wherein the conformal insulation layer is formed by chemical vapor deposition techniques.

3. The method of claim 1, wherein the second insulation layer and the third insulation layer are independently formed by one of chemical vapor deposition techniques and spin-on techniques.

4. A method of forming an innerlayer dielectric having a dielectric constant of about 1, comprising:
    providing a semiconductor substrate having at least two metal lines thereon;
    providing a conformal silicon nitride layer over the substrate and metal lines, the conformal silicon nitride layer having a substantially uniform thickness from about 1,000 Å to about 3,000 Å;
    forming a first insulation layer over the conformal silicon nitride layer, the first insulation layer comprising a void positioned between two metal lines, the void comprising an inert gas and the first insulation layer comprising at least one of silicon dioxide, fluorine doped silicon glass, tetraethylorthosilicate, phosphosilicate glass, borophosphosilicate glass, and a low K polymer material;
    at least one of thinning and planarizing the first insulation layer; and
    forming a second insulation layer having a thickness from about 2,500 Å to about 10,000 Å over the first insulation layer.

5. The method of claim 4, wherein the first insulation layer has a thickness from about 1,000 Å to about 20,000 Å.

6. The method of claim 4, wherein the first insulation layer is formed by chemical vapor deposition techniques and the second insulation layer is formed by spin-on techniques.

7. An innerlayer dielectric semiconductor structure, comprising:
    a semiconductor substrate having at least two metal lines thereon;
    a conformal insulation layer over the semiconductor substrate and metal lines, the conformal insulation layer comprising silicon nitride and having a substantially uniform thickness from about 1,000 Å to about 5,000 Å;
    a second insulation layer comprising silicon dioxide over the conformal insulation layer, the second insulation layer comprising a void positioned between two metal lines, the void comprising an inert gas; and
    a third insulation layer comprising tetraethylorthosilicate over the second insulation layer.

8. The innerlayer dielectric semiconductor structure of claim 7, wherein the conformal insulation layer comprises at least one of silicon nitride, silicon dioxide, and silicon oxynitride.

9. The innerlayer dielectric semiconductor structure of claim 7, wherein the second insulation layer and the third insulation layer independently comprise at least one of silicon dioxide, fluorine doped silicon glass, tetraethylorthosilicate, phosphosilicate glass, borophosphosilicate glass, a spin-on glass, and a low K polymer material.

10. The innerlayer dielectric semiconductor structure of claim 7, wherein the second insulation layer and the third insulation layer independently have a thickness from about 2,000 Å to about 15,000 Å.

11. An innerlayer dielectric semiconductor structure, comprising:
    a semiconductor substrate having at least two metal lines thereon;
    a conformal silicon nitride layer over the semiconductor substrate and metal lines, the conformal silicon nitride layer having a substantially uniform thickness from about 1,000 Å to about 3,000 Å;
    a first insulation layer over the conformal silicon nitride layer, the first insulation layer comprising a void positioned between two metal lines, the void comprising an inert gas and the first insulation layer comprising at least one of silicon dioxide, fluorine doped silicon glass, tetraethylorthosilicate, phosphosilicate glass, borophosphosilicate glass, and a low K polymer material; and
    a second insulation layer having a thickness from about 2,500 Å to about 10,000 Å over the first insulation layer.

12. The innerlayer dielectric semiconductor structure of claim 11, wherein the metal lines comprise at least one of aluminum, tungsten and copper.

13. The innerlayer dielectric semiconductor structure of claim 11, wherein the first insulation layer and the second insulation layer independently comprise at least one of silicon dioxide, fluorine doped silicon glass, tetraethylorthosilicate, phosphosilicate glass, borophosphosilicate glass, and a low K polymer material.

14. The innerlayer dielectric semiconductor structure of claim 11, wherein the first insulation layer and the second insulation layer comprise different materials.

* * * * *